(12) United States Patent
Ting

(10) Patent No.: US 6,881,980 B1
(45) Date of Patent: Apr. 19, 2005

(54) PACKAGE STRUCTURE OF LIGHT EMITTING DIODE

(75) Inventor: Chu-Chi Ting, Hualien (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 0 days.

(21) Appl. No.: 10/710,075

(22) Filed: Jun. 17, 2004

(51) Int. Cl.⁷ .................. H01L 27/15; H01L 31/12; H01L 33/00
(52) U.S. Cl. .............. 257/81; 257/82; 257/84; 257/98; 257/99; 257/100
(58) Field of Search .................. 257/81–82, 84, 257/98, 99, 100

(56) References Cited

U.S. PATENT DOCUMENTS 5,907,151 A * 5/1999 Gramann et al. ........ 250/214.1

* cited by examiner

Primary Examiner—Thien F Tran
(74) Attorney, Agent, or Firm—Jiang Chyun IP Office

(57) ABSTRACT

The present invention relates to a package structure for a light emitting diode (LED). The LED package structure of this invention includes a package housing having at least a trench and at least two leads. The package structure includes at least a die or an LED chip disposed on the bottom surface of the trench, while two electrodes of the die are respectively electrically connected to the ends of two leads on the bottom surface of the trench. A transparent plate of glass or crystal materials is mounted and connected to the housing by anodic bonding or glue bonding, to seal the trench, while the other ends of leads are exposed on the surface of the housing without being covered by the transparent plate.

10 Claims, 4 Drawing Sheets

PACKAGE STRUCTURE OF LIGHT EMITTING DIODE

BACKGROUND OF INVENTION

1. Field of Invention

The present invention relates to a package structure of a light emitting diode. More particularly, the present invention relates to a package structure of a light emitting diode having a package housing of a silicon optical bench.

2. Description of Related Art

The mechanism of light emitting diodes (LEDs) relates to light emission resulting from the released energy during the recombination of electrons and holes in the semiconductor materials. Due to numerous advantages of the light emitting diodes including miniature sizes, durability, low-driven voltages, low electricity consumption, fast response speed and good monochromatism, they are widely applied as light emitting elements in various electronic products, display panels and communication products.

For the light emitting diodes of various types, the light emitting diodes can be categorized as visible light LEDs and non-visible light (infrared light) LEDs based on the emitting light wavelength. The visible light LEDs includes red, red-orange, orange, yellow, yellow-green, green, blue and white light LEDs. Following the energy preservation and environmental protection concepts promoted by the developed countries America, Europe and Japan, the whilte light LEDs become one of the most potential products among these LEDs. Because the white light LEDs have small sizes, low power consumption and long lifetime but without heat radiation, they can replace traditional white light bulbs by overcome typical problems of the white light bulb and become the green luminance source in the twenty-first century.

FIG. 1 shows a package structure for a conventional surface mounting device (SMD) type LED. Referring to FIG. 1, a package housing 10 having a trench 11 is provided and an LED chip 12 is placed onto a bottom of the trench 11. Two electrodes of the LED chip 12 are respectively connected to the exposed two leads 16, 18 set within the trench 11. For both leads 16, 18, one end is exposed within the trench, while the other end extends to the bottom surface of the housing 10. A transparent molding compound 19 is formed by filling transparent resin into the trench 11, and the LED chip 12 and the leads 16, 18 within the trench 11 are encapsulated by the transparent molding compound 19. During the LED operation, by applying voltages of different polarity respectively to the uncovered ends of two leads 16, 18 that extend to the bottom surface of the package structure, light is generated by the LED chip 12 and emits through the transparent molding compound 19.

For the conventional LED package structure, the housing 10 and the molding compound 19 are made of resin materials, such as, epoxy. However, the resin materials when exposure to UV light can easily become degenerated or fragile. Therefore, if UV LEDs or other LEDs of near UV wavelength are fitted in this conventional LED package structure, the emitting UV or near UV light may damage the packaging materials, thus lowering the brightness or accelerating aging of the device. As a result, the application of certain types of LEDs is severely limited by using this type of package structure.

SUMMARY OF INVENTION

In order to provide solutions for the aforementioned problems, the present invention provides a LED package structure including a housing of a silicon optical bench (SiOB). The present invention also provides an LED package structure including a transparent plate made of glass or crystal materials. The package structure of the present invention does not use any resin molding materials, so that prior art problems of degeneration or friability can be avoided. Furthermore, the package structure of the present invention ensures that the LED generates unicolor light without color aberration.

As embodied and broadly described herein, the present invention relates to a package structure for a light emitting diode (LED). The LED package structure of this invention includes a package housing having at least a trench and at least two leads. The package structure includes at least a die or an LED chip disposed on the bottom surface of the trench, while two electrodes of the die are respectively electrically connected to the ends of two leads on the bottom surface of the trench. A transparent plate of glass or crystal materials is mounted and connected to the housing by anodic bonding or glue bonding, to seal the trench, while the other ends of leads are exposed on the surface of the housing without being covered by the transparent plate. According to the embodiments of this invention, the housing may, but not limited to, be a silicon optical bench (SiOB).

The package structure of the present invention employs the transparent plate made of glass or a crystal material, thus avoiding using any resin molding materials. Therefore, the present invention can avoid prior art problems of degeneration or friability resulting from exposure to light.

Alternatively, the angle between the bottom surface and the sidewall of the trench of the package housing can be designed to be larger than 90 degrees. A metallic reflective layer is coated over the sidewalls and the bottom surface of the trench, except for those regions occupied by the leads and the die. During the operation of the LED, visible light is generated by the LED chip by applying voltages of different polarity, and the metallic reflective layer can reflect the light to emit through the transparent plate, thus increasing illuminance efficiency.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

The present invention relates to a package structure for a light emitting diode (LED). The package structure of this invention includes a package housing having a trench and at least two leads. For both leads, one end of the lead is disposed on the bottom surface of the trench, while the other end of the lead reaches out and is disposed on the surface of the housing. The package structure includes at least a die or an LED chip disposed on the bottom surface of the trench, while two electrodes of the die are respectively connected to the ends of two leads on the bottom surface of the trench. Then, a transparent plate of glass or crystal materials is mounted and connected to the housing by anodic bonding or glue bonding, to seal the trench, while the other ends of leads are exposed on the surface of the housing without being covered by the transparent plate. According to the embodiments of this invention, the housing may, but not limited to, be a silicon optical bench (SiOB), while other materials, for example, acrylonitrile-butadiene styrene (ABS) materials.

According to one preferred embodiment of this invention, wire bonding technology is employed for connection in the LED package structure, but the scope of the present invention is not limited by the descriptions provided in the embodiments.

Figure 1:
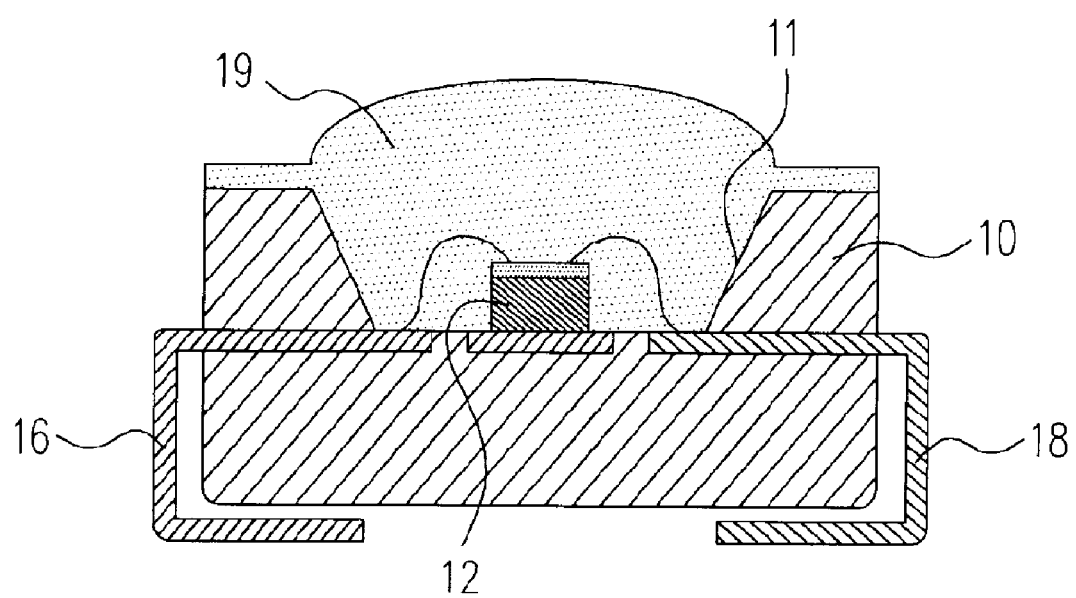
FIG. 1 is a cross-sectional display view of the conventional LED package structure of the surface mounting device type.
Figure 2:
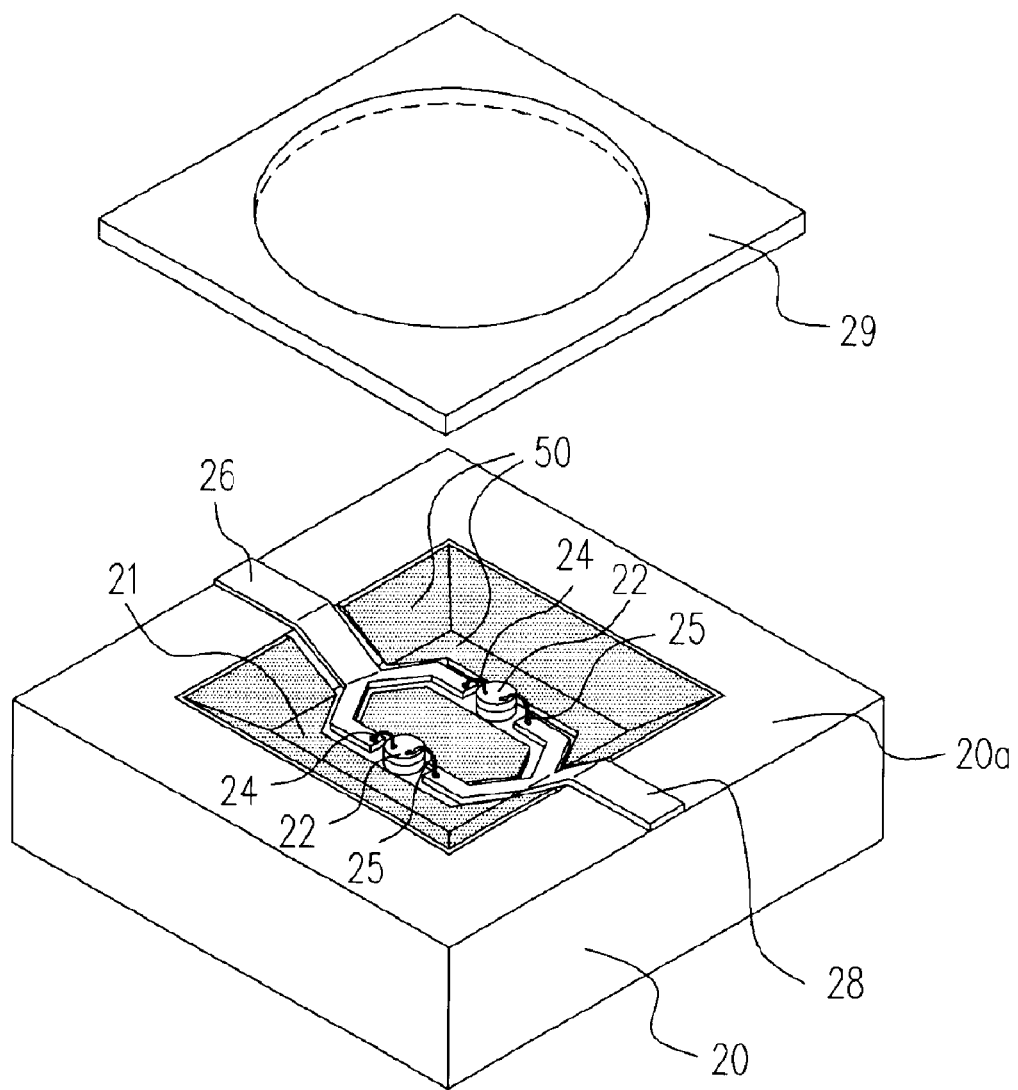
FIG. 2 a display view for an LED package structure after assemblage according to one preferred embodiment of this invention.
Figure 3:
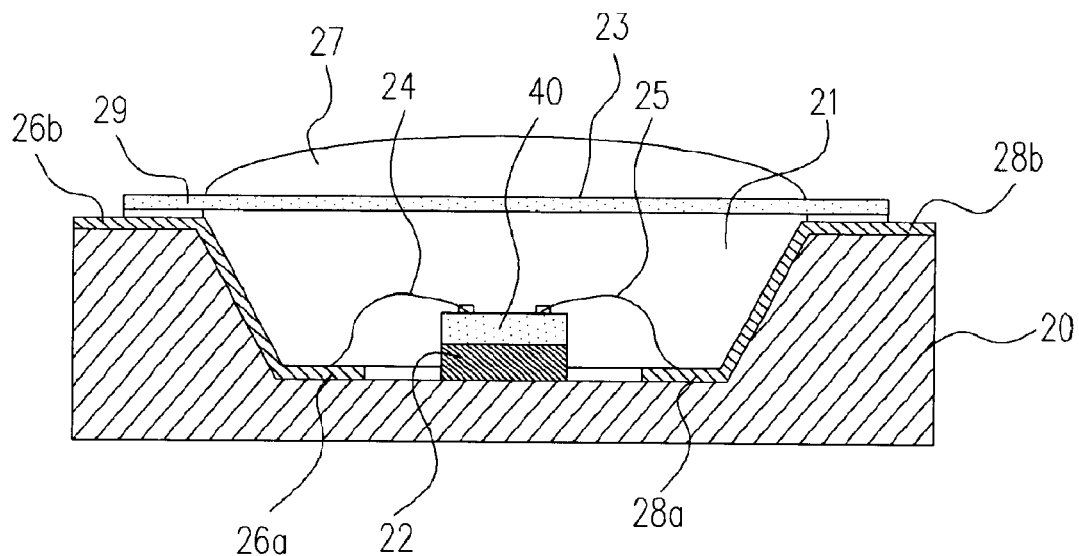
FIG. 3 is a cross-sectional partial display view for the LED package structure of FIG. 2.

FIG. 2 a display view for an LED package structure after assemblage according to one preferred embodiment of this invention, while FIG. 3 is a cross-sectional partial display view for the LED package structure of FIG. 2. Referring to FIGS. 2 and 3, a package housing 20 having a trench 21 is provided and two dies or two LED chip 22 are disposed on a bottom surface of the trench 21. The trench 21 can be either V shaped or U shaped, for example. The package structure includes at least two leads 26, 28. For each of these leads, one end 26a/28a of the lead 26/28 is disposed on the bottom surface of the trench, while the lead 26/28 reaches out and the other end 26b/28b of the lead 26/28 is disposed on the top surface 20a of the housing 20. Then, a wire bonding process is performed, so that two electrodes 23 of the LED chip 22 are respectively connected to the ends 26a, 28a of two leads 26, 28 in the trench 21, through two wires 24, 25. A transparent plate 29 is mounted and connected to the top surface 20a of the housing 20 by, for example, anodic bonding or glue bonding. The transparent plate 29 covers and seals the trench 21 and a sealed vacuum space is formed between the transparent plate 29 and the trench 21, while the other ends 26b/28b of leads 26/28 are exposed on the top surface 20a of the housing 20 without being covered by the transparent plate 29. The transparent plate is made of a glass or a crystal material such as sapphire, for example. During the operation of the LED, by applying voltages of different polarity respectively to the uncovered ends 26b/28b of two leads 26/28, visible light is generated by the LED chip 22 and emits through the transparent plate 29.

Alternatively, the transparent plate may further include a lens region 27 in the middle portion of the transparent plate for helping converging of the light. The lens region 27 can be formed by adjusting the thickness of the transparent plate 29, or coating a polymer material.

Figure 4:
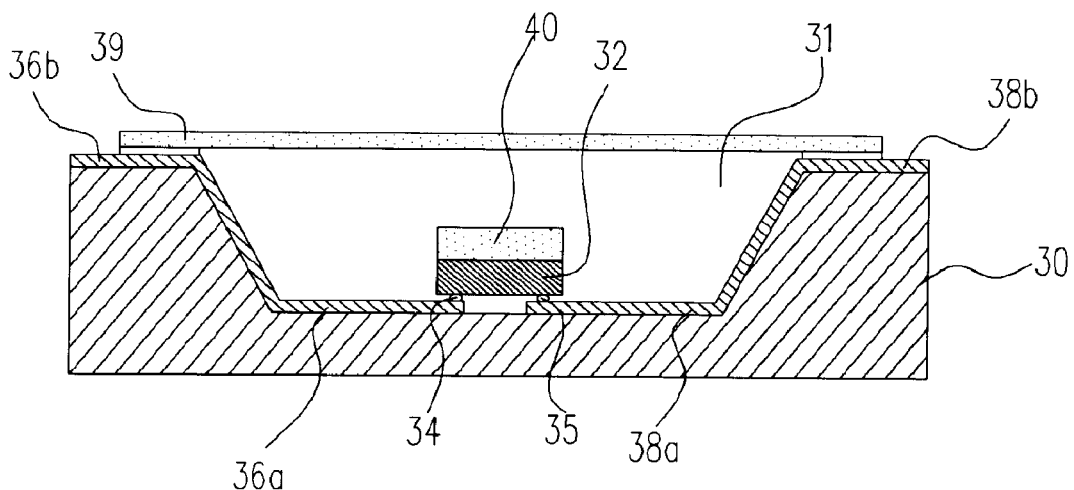
FIG. 4 a cross-sectional display view for an LED package structure according to another preferred embodiment of this invention.

FIG. 4 a cross-sectional display view for an LED package structure according to another preferred embodiment of this invention. According to another preferred embodiment of this invention, bump bonding technology is employed for connection in the LED package structure, but the scope of the present invention is not limited by the descriptions provided in the embodiments. A package housing 30 having a trench 31 is provided and at least one die or one LED chip 32 is disposed on a bottom surface of the trench 31. The trench 31 can be either V shaped or U shaped, for example. The package structure includes at least two leads 36, 38, and one end 36a/38a of the lead is disposed on the bottom surface of the trench 31 and the other end 36b/38b of the lead is disposed on the top surface of the housing 30. Through the bump bonding technology, two bumps (or balls) 34, 35 are arranged respectively on the two electrodes (not shown) of the LED chip 32. Two electrodes of the LED chip 32 are respectively connected to the ends 36a, 38a of two leads 26, 28 in the trench 21, through the two bumps 34, 35. A transparent plate 39 is mounted and connected to the top surface of the housing 30 by, for example, anodic bonding or glue bonding. The transparent plate 39 covers and seals the trench 31 and a sealed vacuum space is formed between the transparent plate 39 and the trench 31, while the other ends 36b/38b of leads are exposed on the top surface of the housing 30 without being covered by the transparent plate 39. The transparent plate is made of a glass or a crystal material such as sapphire, for example.

In accordance with the embodiments, referring to FIGS. 3 and 4, a fluorescence layer 40 of a specific thickness is arranged on the die or the LED chip 22, 32. The fluorescence layer 40 includes at least one fluorescent material, which emits light of a specific color after being illuminated by the unicolor light generated by the LED chip 22, 32. Therefore, under the lens effect of the transparent plate 29, 39, the visible light generated by the LED chip 22, 32 and the stimulated fluorescence light from the fluorescence layer 40 mix into a uniform multiple-wavelength white light without color aberration. Alternatively, in accordance with the embodiments, at least one additional LED chip (die) that emits a light of a color different to, or even complementary to that of the LED chip 22, 32 is arranged within the trench 21, 31. By doing so, under the lens effect of the transparent plate 29, 39, the unicolor light generated by the LED chip 22, 32 and the complementary unicolor light generated by the additional LED chip mix into a uniform three-wavelength-band white light without color aberration.

Furthermore, after disposing the die to the bottom surface of the trench, the method of mounting the transparent plate to the top surface of the housing is not limited to anodic bonding or glue bonding, but any techniques available to one of ordinary skill in this field can be used. As long as, the transparent plate covers and seals the trench and a sealed space is formed between the transparent plate and the trench. The sealed space formed between the transparent plate and the trench is not limited to a sealed vacuum space, but can be a sealed space formed between the transparent plate and the trench and filled with noble gas.

For efficiently increasing the radiance for the LED package structure, the angle between the bottom surface of the trench 21 and the sidewall of the trench 21 is designed to be larger than 90 degrees, referring to FIG. 2. A metallic reflective layer 50 is coated over the sidewalls and the bottom surface of the trench 21, except for those regions occupied by the leads and the die. The metallic reflective layer 50 is not in physical contact with the leads or the die and a specific distance between the metallic reflective layer 50 and the leads/die is usually preserved for insulation purposes. During the operation of the LED, visible light is generated by the LED chip 22 by applying voltages of different polarity, and the metallic reflective layer 50 covering the sidewalls of the trench can reflect the light to emit through the transparent plate 29. Therefore, the metallic reflective layer helps increasing illuminance efficiency.

Figure 5:
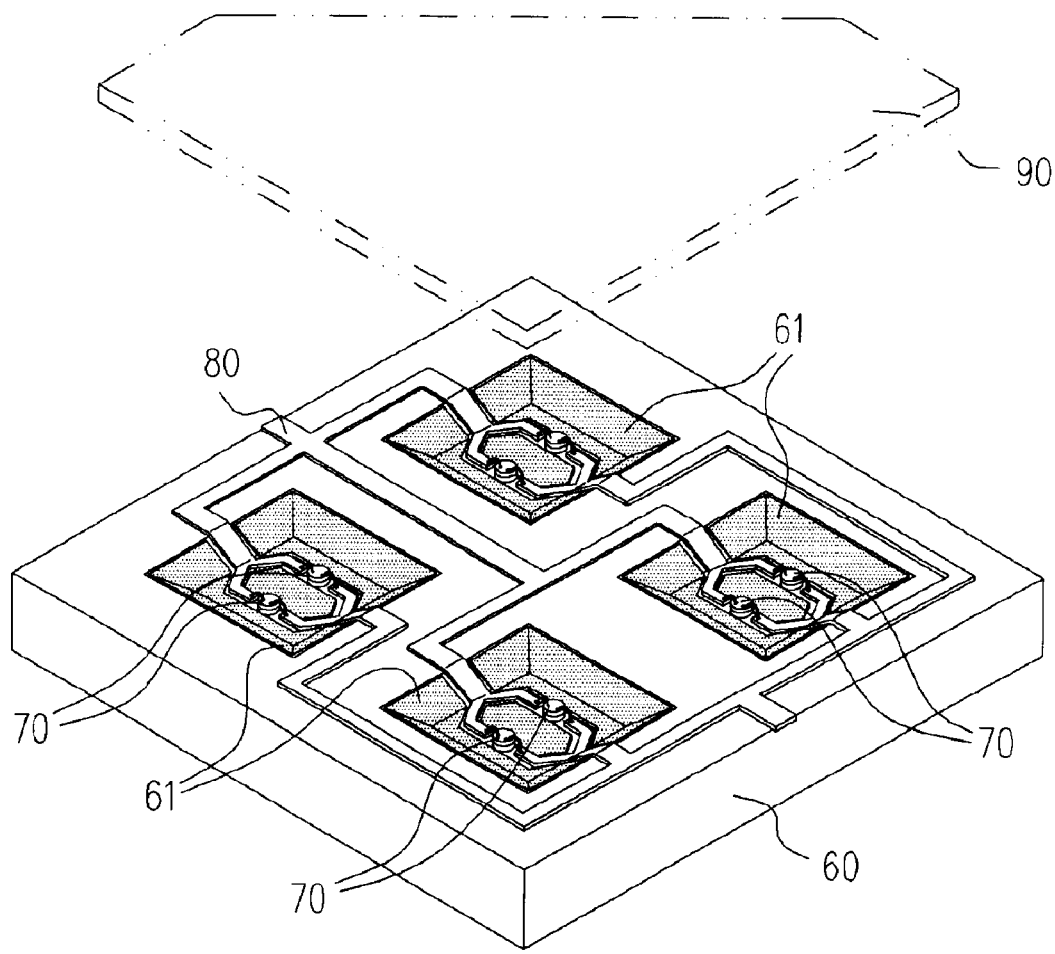
FIG. 5 a display view for the LED package structure before assemblage according to another preferred embodiment of this invention.

Alternatively, the housing 20, 30 may includes more than one trench 21, 31, depending on the package requirements and the device properties. FIG. 5 a display view for the LED package structure before assemblage according to another preferred embodiment of this invention. As shown in FIG. 5, the housing 60 includes at least four trenches 61, while at least one die (LED chip) 70 is disposed in each trench 61. The dies in the trenches can emit light of different colors respectively, or light of the same color. After mounting the transparent plate 90 to seal the trenches 61, the LED package can emit light of either different colors or the same colors, at the same time or at different times depending on the arrangements of the leads 80 and the application of voltages through the leads 80. In this way, more choices of light emission are provided when the package structure is to be assembled to be an LED display panel.

The package structure of the present invention employs the transparent plate made of glass or a crystal material, thus avoiding using any resin molding materials. Therefore, the present invention can avoid prior art problems of degeneration or friability resulting from exposure to light. Furthermore, the vacuum space or the noble gas filled space between the transparent plate and the trench in the package structure of the present invention ensures that the LED generates unicolor light without color aberration.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light emitting diode package structure, comprising:

a housing having at least a trench;

at least two leads disposed on the housing, wherein a first end of any of the leads is disposed on a bottom surface of the trench, while a second end of any of the leads is disposed on a top surface of the housing;

at least a light emitting diode chip disposed on the bottom surface of the trench, wherein two electrodes of the light emitting diode chip are electrically connected respectively to the first ends of the two leads; and a transparent plate disposed on top of the trench and connected to the top surface of the housing, wherein the transparent plate covers and seals the trench to form a sealed space between the transparent plate and the trench, while the second ends of the two leads on the top surface of the housing are exposed.

2. The package structure of claim 1, wherein the housing is a silicon optical bench.

3. The package structure of claim 1, wherein the transparent plate is connected to the top surface of the housing by anodic bonding.

4. The package structure of claim 1, wherein the transparent plate is connected to the top surface of the housing by glue bonding.

5. The package structure of claim 1, wherein a material of the transparent plate includes glass.

6. The package structure of claim 1, wherein a material of the transparent plate includes a crystal material.

7. The package structure of claim 1, further comprising a fluorescence layer disposed on the light emitting diode chip, wherein the fluorescence layer includes a fluorescent material.

8. The package structure of claim 1, further comprising a noble gas filled within the sealed space.

9. The package structure of claim 1, wherein an angle between the bottom surface of the trench and a sidewall of the trench is larger than 90 degrees.

10. The package structure of claim 1, further comprising a metallic reflective layer covering the sidewalls and the bottom surface of the trench except for areas occupied by the two leads and the light emitting diode chip, wherein the metallic reflective layer is apart from the two leads and the light emitting diode chip and a distance is kept between the metallic reflective layer and the two leads and the light emitting diode chip for insulation.

* * * * *